(12) United States Patent
Chae

(10) Patent No.: US 9,374,909 B2
(45) Date of Patent: Jun. 21, 2016

(54) METHOD OF MANUFACTURING LED MODULE

(71) Applicants: Hyeon-Woo Chae, Kyung Gi-Do (KR); Bardwell & McAlister Inc., Sun Valley, CA (US)

(72) Inventor: Hyeon-Woo Chae, Kyung Gi-Do (KR)

(73) Assignee: BARDWELL & MCALISTER INC., Sun Valley, CA (US)

( * ) Notice: Subject to any disclaimer, the term of this patent is extended or adjusted under 35 U.S.C. 154(b) by 138 days.

(21) Appl. No.: 14/195,739

(22) Filed: Mar. 3, 2014

(65) Prior Publication Data

US 2014/0259654 A1 Sep. 18, 2014

Related U.S. Application Data

(63) Continuation of application No. PCT/KR2014/000221, filed on Jan. 9, 2014.

(30) Foreign Application Priority Data

Mar. 14, 2013 (KR) .................. 10-2013-0027516

(51) Int. Cl.
*H05K 3/32* (2006.01)
*H01L 25/075* (2006.01)
*H01L 33/62* (2010.01)
*H01L 33/64* (2010.01)
*H05K 3/20* (2006.01)

(52) U.S. Cl.
CPC .............. *H05K 3/32* (2013.01); *H01L 25/0753* (2013.01); *H01L 33/62* (2013.01); *H01L 33/642* (2013.01); *H01L 2924/0002* (2013.01); *H05K 3/202* (2013.01); *H05K 2201/0397* (2013.01); *H05K 2201/10106* (2013.01); *Y10T 29/4913* (2015.01)

(58) Field of Classification Search
CPC .................................. F21K 9/00; H05K 3/202
USPC ............ 29/832, 592.1; 362/249.02, 382, 218; 313/512, 496
See application file for complete search history.

(56) References Cited

U.S. PATENT DOCUMENTS

| | | | | |
|---|---|---|---|---|
| 6,005,333 A | * | 12/1999 | Kaneko | ............ G03G 15/04054 313/306 |
| 7,201,511 B2 | * | 4/2007 | Moriyama | ................ F21K 9/00 257/668 |
| 9,129,832 B2 | * | 9/2015 | Pan | ...................... H01L 25/0753 |
| 2005/0239342 A1 | * | 10/2005 | Moriyama | ................ F21K 9/00 439/699.2 |
| 2008/0272390 A1 | * | 11/2008 | Wang | ........................ F21K 9/00 257/99 |
| 2009/0213583 A1 | * | 8/2009 | Chang | ....................... F21K 9/00 362/218 |
| 2014/0259654 A1 | * | 9/2014 | Chae | ........................ H05K 3/32 29/832 |

* cited by examiner

*Primary Examiner* — Minh Trinh
(74) *Attorney, Agent, or Firm* — Blakely Sokoloff Taylor & Zafman LLP

(57) ABSTRACT

The present invention relates to a method of manufacturing an LED module, which enhances heat dissipation efficiency of the LED module through a configuration of installing a plurality of electrically separated conductive electrode plates to be close to each other on a same plane, stacking insulation layers on the top and bottom sides of the electrode plates, forming a plurality of ground holes on one side of the insulation layers to expose the electrode plates, and then grounding both electrodes of LED chips to the separated electrode plates.

9 Claims, 9 Drawing Sheets

-- PRIOR ART --

METHOD OF MANUFACTURING LED MODULE

TECHNICAL FIELD

The present invention relates to a method of manufacturing an LED module, which enhances heat dissipation efficiency of the LED module through a configuration of installing a plurality of electrically separated conductive electrode plates to be close to each other on a same plane, stacking insulation layers on the top and bottom sides of the electrode plates, forming a plurality of ground holes on one side of the insulation layers to expose the electrode plates, and then grounding both electrodes of LED chips to the separated electrode plates.

BACKGROUND ART

Generally, an LED lamp consumes extremely low power and has a quite long lifespan compared with a halogen or neon lamp and, in addition, is advantageous in that it may produce further diverse colors compared particularly with a fluorescent or halogen lamp.

In addition, the LED lamp is configured by arranging LED modules having a plurality of LEDs in a specific array and installing the LED modules on the ceiling or a wall, and since the LED lamp generates a considerably large amount of heat by the nature of the LED element when LED lamp is driven, heat dissipation is a problem that should be solved, and a metal PCB has been developed recently to solve the problem.

In addition, the metal PCB is structured by forming a trench having a predetermined depth, forming terminals through electrolytic plating, uniformly arranging a plurality of LED elements inside the trench, and then connecting the LED elements with each other or connecting the LED elements and the terminals through wire bonding.

Then, the LED module is formed by filling a fluorescent material in the trench of a comparatively large area where the plurality of LED elements are arranged and filling optically transparent resin up to the surface to include a portion in which the terminals are formed on the trenched Pattern.

In relation to this technique, Korean Patent No. 1105454 discloses a technique of a printed circuit board for an LED lighting apparatus and a manufacturing method thereof, and as shown in FIG. 1, it is schematically configured of a heat sink plate 10, an insulation substrate 20, an insulation film 30 and a metal thin film 40, and a plating prevention layer 50 of the same size is formed on the bottom surface of the heat sink plate 10 to prevent plating.

In addition, the heat sink plate 10 is made of a metal material having a shape of a plate, and the insulation substrate 20 is formed to have an outer diameter the same as that of the heat sink plate 10 and a thickness thinner, if possible, than that of the heat sink plate 10, and a plurality of first holes 21 is formed to vertically penetrated the heat sink plate 10 and the insulation substrate 20.

Then, connection terminal pads 23 are formed on the surface of the insulation substrate 20 together with a circuit pattern, and second holes 41 are formed on the surface of the metal thin film 40 on a concentric circle of the first holes 21 formed on the insulation substrate 20, and the second holes 41 are installed to upwardly expose the connection terminal pads 23 formed on the peripheral side of the first holes 21 of the insulation substrate 20.

Then, the LED lighting apparatus is provided by inserting LED elements in the first holes 21 of the insulation substrate 20, filling a fluorescent material in the first holes 21 where the LED elements are inserted, and filling an optically transparent molding material in the second holes 41 formed on the metal thin film 40 on the top of the first holes 21.

However, since the printed circuit board described above should be provided with the heat sink plate 10 for dissipating heat and the metal thin film 40 for connecting power, it is disadvantageous in that the PCB is difficult to manufacture, and additional parts are required.

Furthermore, the insulation layer should be formed to configure a pattern of the PCB, and the insulation layer operates as an insulator for blocking a passage which transfers the heat generated by the LED elements to the metal thin film 40, and thus it is disadvantageous in that the heat may not be effectively discharged outside.

DISCLOSURE OF INVENTION

Technical Problem

Therefore, the present invention has been made in view of the above problems, and it is an object of the present invention to provide a method of manufacturing an LED module which may simultaneously perform functions of electrodes and heat sink plates using one part, easily connect LED modules in width and length directions, easily manufacture the LED module with a simple configuration, enhance heat dissipation efficiency by maximizing a heat sink area using a copper plate as an electrode, promptly and easily connect the LED modules, modify and apply the LED module in a variety of forms since the LED module can be freely modified, and enhance durability of the LED module.

Technical Solution

To accomplish the above object, according to one aspect of the present invention, there is provided a method of manufacturing an LED module, the method including the steps of: installing a plurality of electrically separated conductive electrode plates to be close to each other on a same plane; stacking insulation layers on the top and bottom sides of the electrode plates; forming a plurality of ground holes on one side of the insulation layers to expose the electrode plates; and grounding both electrodes of LED chips to the separated electrode plates.

In addition, the present invention provides a method of manufacturing an LED module, in which the electrode plates are arranged to have a zigzag shape so that portions close to each other are alternately arranged on the cross section, and terminals are exposed at both sides of the LED module in a length direction.

In addition, the present invention provides a method of manufacturing an LED module, in which the electrode plates are arranged in pair toward left and right sides of the LED module in a width direction, and a plurality of terminals is exposed at both sides of the LED module in a length direction.

In addition, the present invention provides a method of manufacturing an LED module, in which the electrode plate arranges a center electrode plate positioned at a center and a plurality of edge electrode plates positioned at both sides of the center electrode plate toward a width direction of the LED module, and terminals are respectively exposed at both sides of the LED module in a length direction.

Subsequently, the present invention provides a method of manufacturing an LED module, in which the electrode plates are provided with a plurality of penetration holes or embossing parts.

In addition, the present invention provides a method of manufacturing an LED module, in which the insulation layers are provided with flow holes so that the electrode plates may be exposed to an air layer.

In addition, the present invention provides a method of manufacturing an LED module, in which a terminal is provided at one side of each of the electrode plates in a length or width direction, and a connection means is formed in one piece at least at one or more of the terminals.

In addition, the present invention provides a method of manufacturing an LED module, in which the electrode plates are formed such that the electrode plate of the positive electrode is formed to be relatively thicker or wider than the electrode plate of the negative electrode.

In addition, the present invention provides a method of manufacturing an LED module, in which the connection means is formed in one piece together with an edge connection surface which is bent and a center connection surface elastically supported through cut portions.

In addition, the present invention provides a method of manufacturing an LED module, in which the insulation layers are selectively formed through molding or by attaching an insulation film.

Advantageous Effects

According to the present invention as described above, the method of manufacturing an LED module has an effect of easily connecting the LED module in width and length directions, easily manufacturing the LED module with a simple configuration, enhancing heat dissipation efficiency by maximizing a heat sink area using a copper plate as an electrode, promptly connecting the LED module, modifying and applying the LED module in a variety of forms since the LED module can be freely modified, and enhancing durability of the LED module.

BEST MODE FOR CARRYING OUT THE INVENTION

The preferred embodiments of the present invention will be hereafter described in detail with reference to the accompanying drawings.

Figure 1:
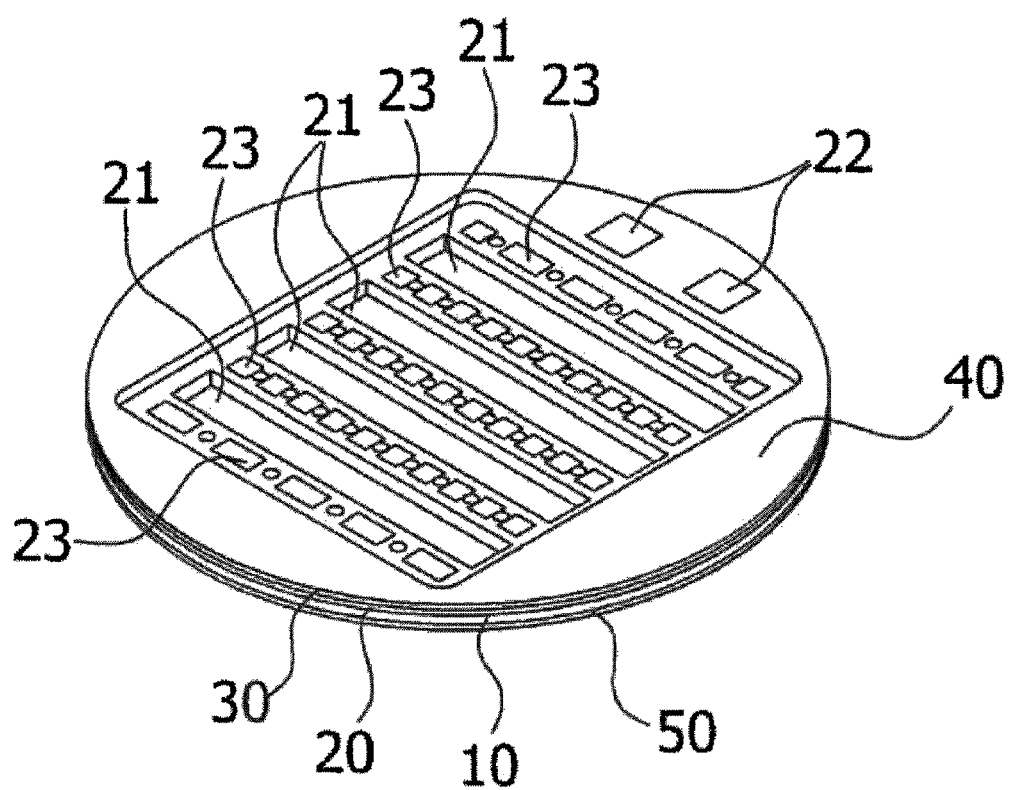
FIG. 1 is a perspective view showing a conventional printed circuit board for an LED lighting apparatus.
Figure 2:
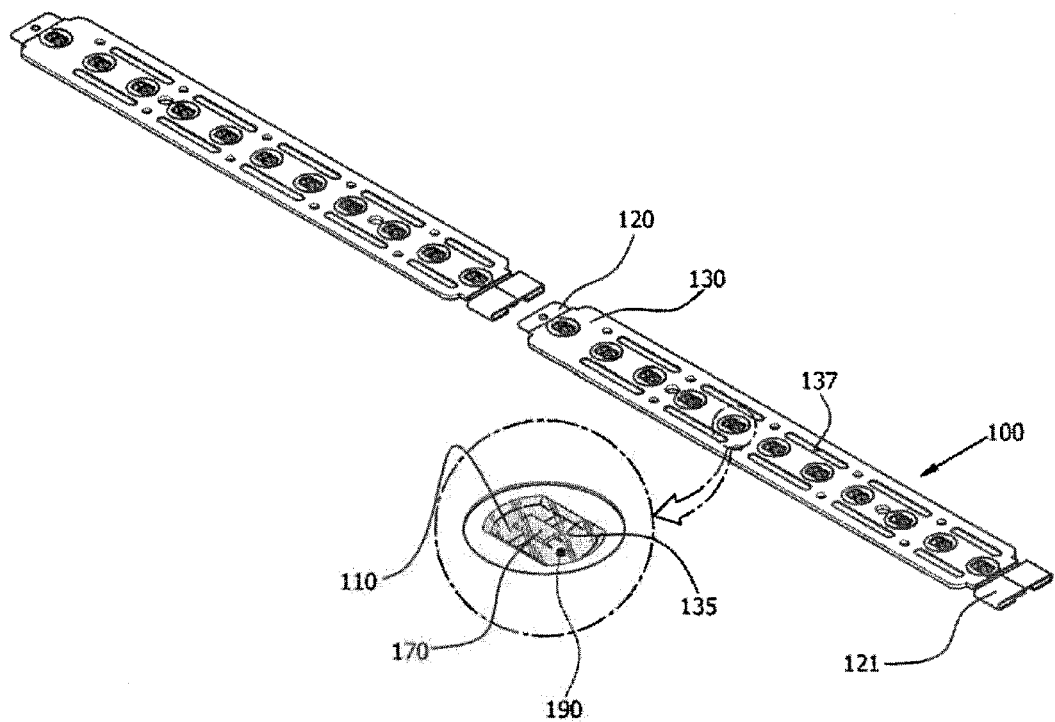
FIGS. 2 to 5 are a perspective view, an exploded view, a connection state view and a cross-sectional view of a combined state respectively showing an LED module according to the present invention.
Figure 3:
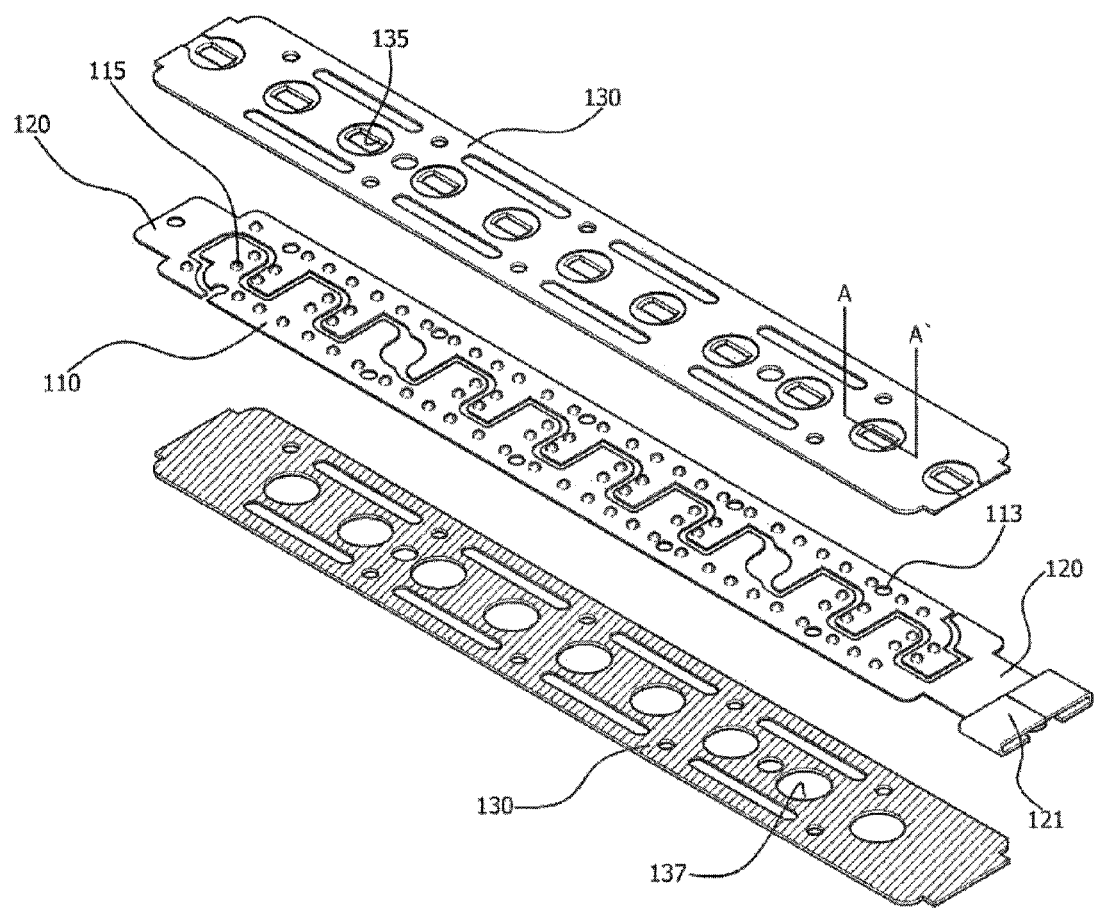
Figure 4:
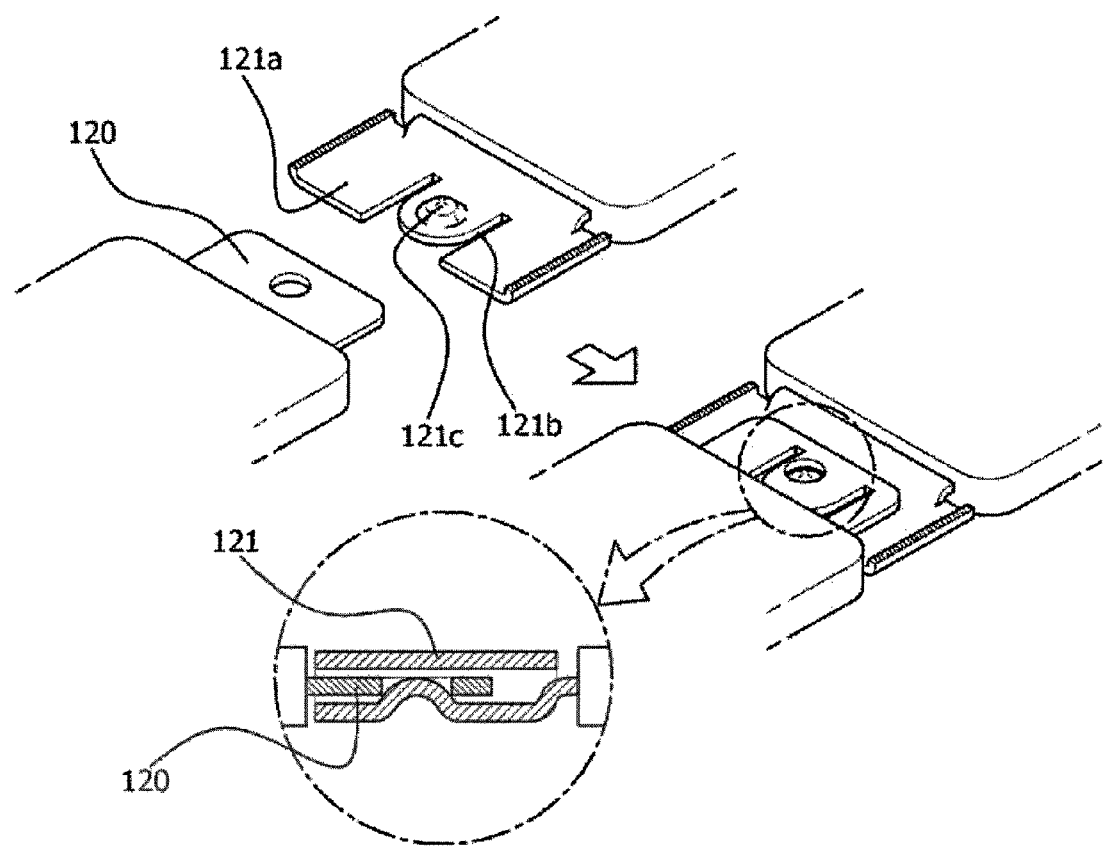
Figure 5:
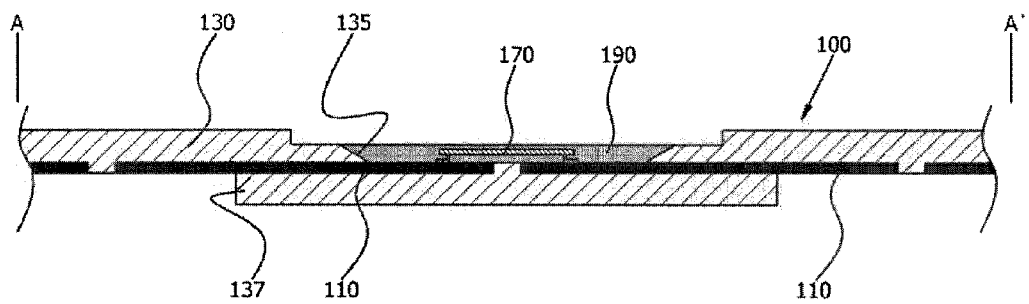
Figure 6:
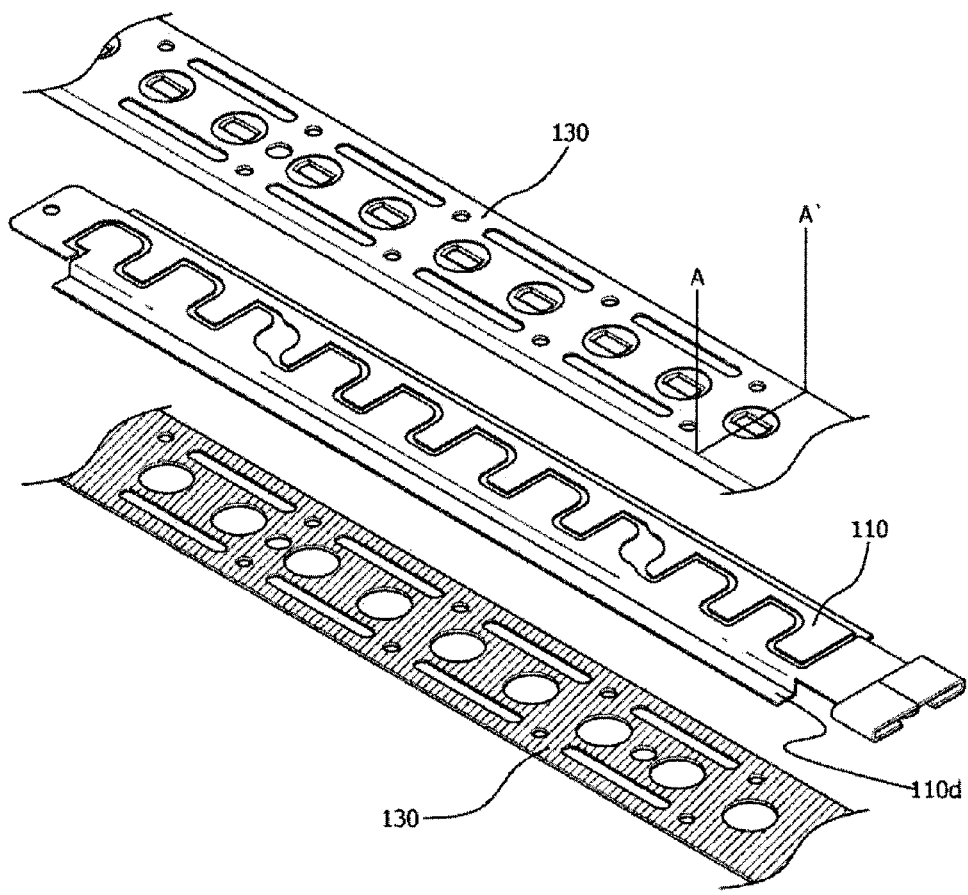
FIGS. 6 and 7 are an exploded view and a cross-sectional view of a combined state respectively showing an LED module according to the present invention.
Figure 7:
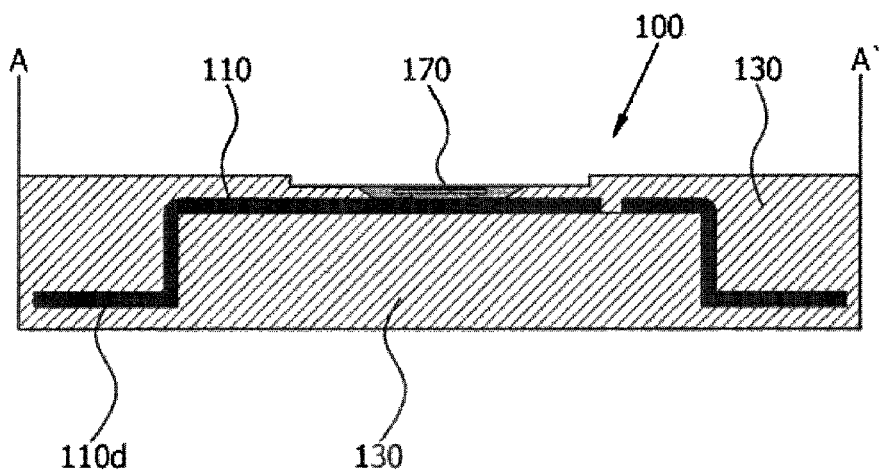
Figure 8:
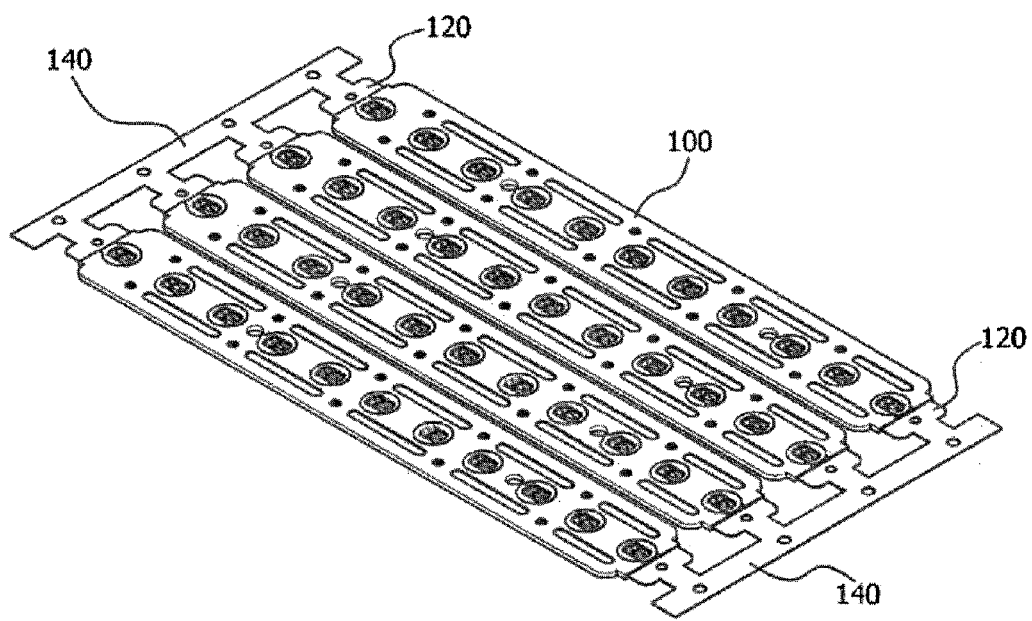
FIGS. 8 to 10 are perspective views respectively showing an LED module according to another embodiment of the present invention.
Figure 9:
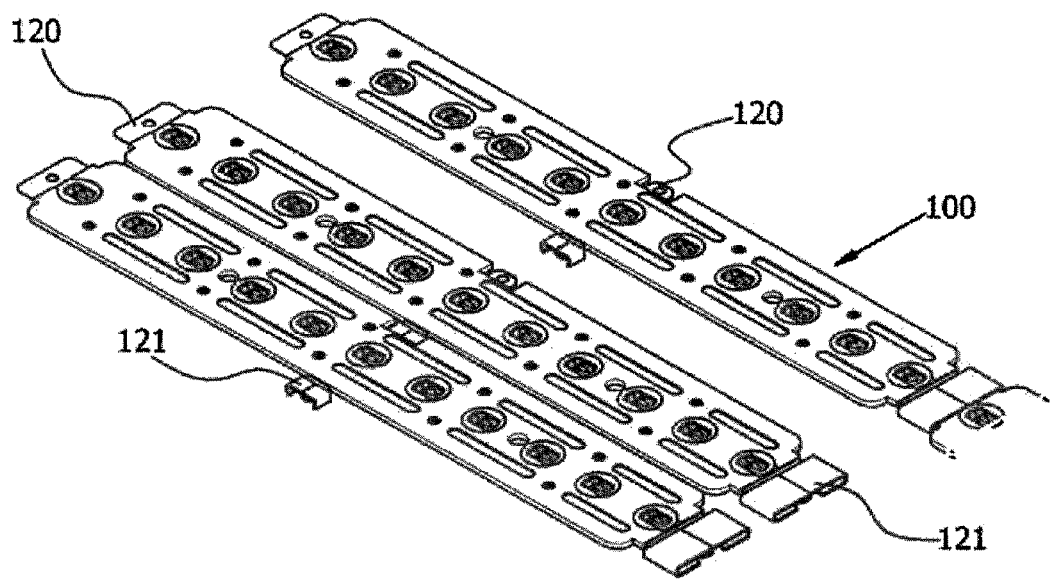
Figure 10:
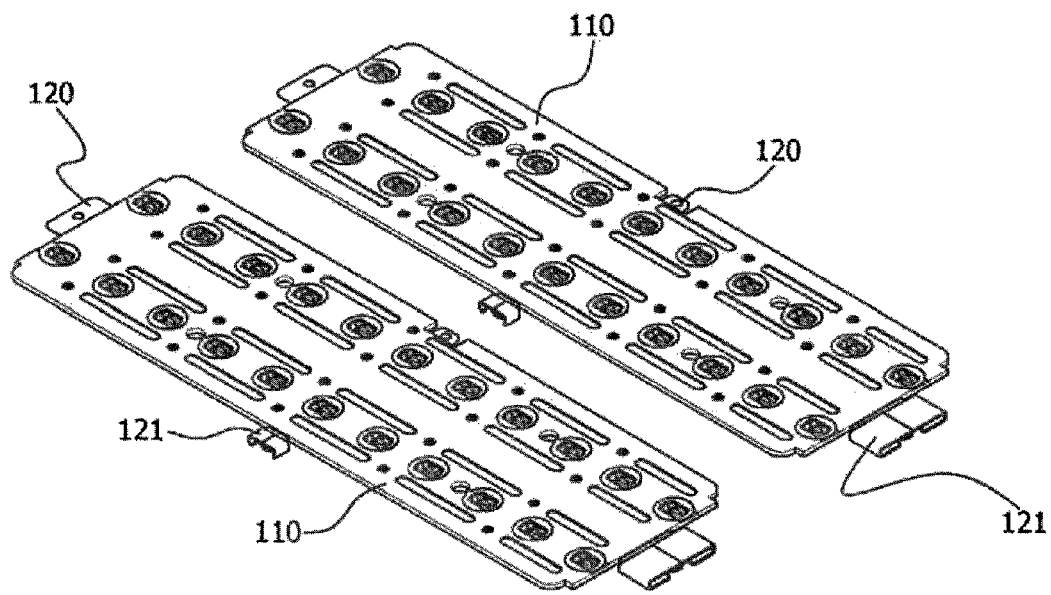
Figure 11:
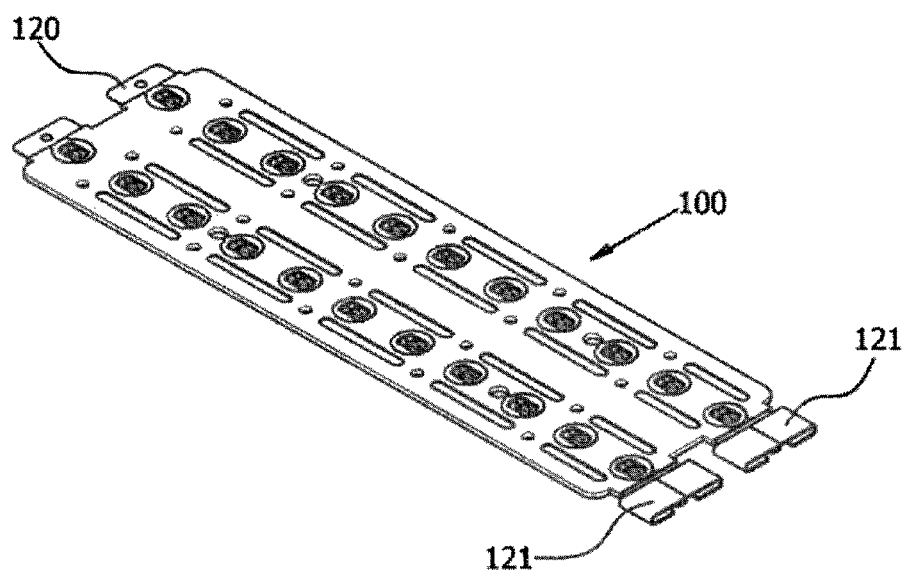
FIGS. 11 and 12 are a perspective view and a plan view respectively showing an LED module according to a first embodiment of the present invention.
Figure 12:
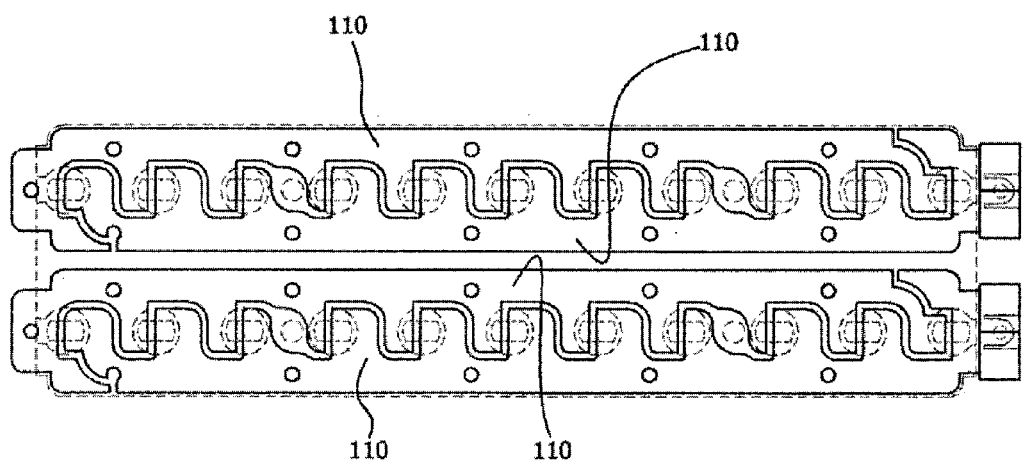
Figure 13:
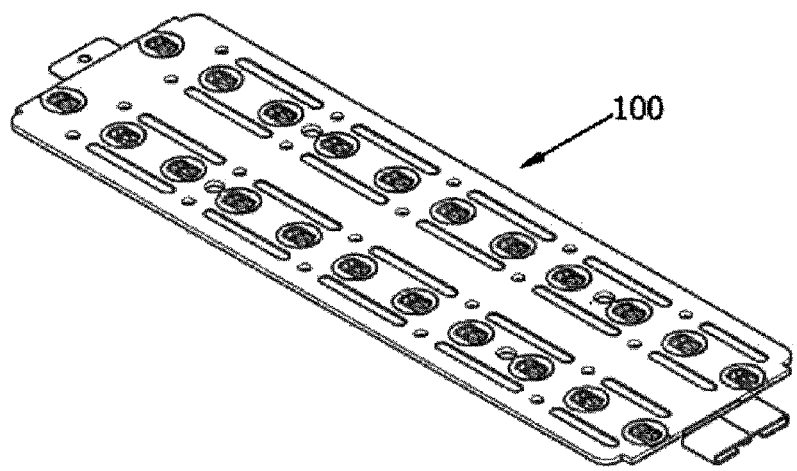
FIGS. 13 and 14 are a perspective view and a plan view respectively showing an LED module according to a second embodiment of the present invention.
Figure 14:
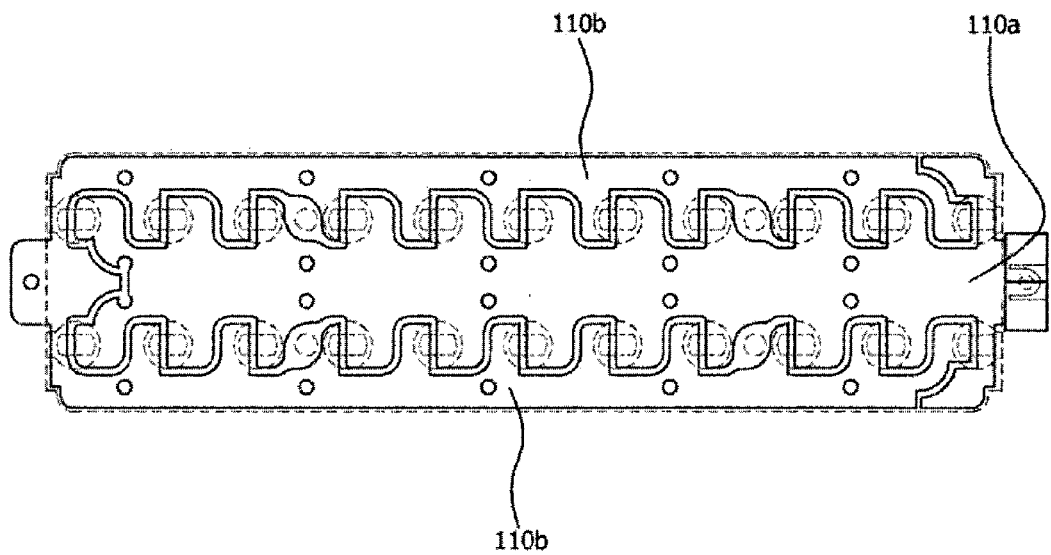

FIGS. 2 to 5 are a perspective view, an exploded view, a connection state view and a cross-sectional view of a combined state respectively showing an LED module according to the present invention, FIGS. 6 and 7 are an exploded view and a cross-sectional view of a combined state respectively showing an LED module according to the present invention, FIGS. 8 to 10 are perspective views respectively showing an LED module according to another embodiment of the present invention, FIGS. 11 and 12 are a perspective view and a plan view respectively showing an LED module according to a first embodiment of the present invention, and FIGS. 13 and 14 are a perspective view and a plan view respectively showing an LED module according to a second embodiment of the present invention.

The LED module 100 of the present invention includes a plurality of electrically separated conductive electrode plates 110 installed to be close to each other on a same plane.

At this point, the electrode plates 110 are configured to face each other so that electrically separated areas may have a minimum area among the entire area and installed to directly connect both electrodes of LED chips to adjacent counterpart electrodes.

Then, insulation layers 130 are formed to be stacked on the top and bottom surfaces of the electrode plates 110.

In addition, a plurality of ground holes 135 is formed on one side of the insulation layers 130 so as to expose a portion of the separated electrode plates 110, and both electrodes of the LED chips 170 are grounded to the separated electrodes through the ground holes 135.

In addition, a filling material 190 made of a phosphor material, an optically transparent molding material or the like is filled to cover the LED chips 170 and the ground holes 135.

At this point, the insulation layers 130 may be provided with flow holes 137 so that the electrode plates 110 may be exposed to the air layer.

Subsequently, the electrode plates 110 are provided with penetration holes 113 for connecting to a plurality of insulation layers 130 or embossing parts 115 for expanding a combining area or a heat sink area.

Meanwhile, a terminal 120 is formed in one piece to be protruded at one side of each of the electrode plates 110 in the length or width direction.

At this point, a connection means 121 is formed in one piece at one side of one or more of the terminals 120 among the terminals 120.

The connection means 121 are formed in one piece together with an edge connection surface 121a which is bent to form the cross section thereof in a shape of character " " as a whole and a center connection surface 121c elastically supported through cut portions 121b connected to both ends of the center connection surface 121c.

Then, the electrode plates 110 are formed to have a zigzag shape on a plane so that portions close to each other are alternately arranged on the cross section.

In addition, the electrode plates 110 are arranged in pair on the left and right sides of the LED module in the width direction.

In addition, the electrode plate 110 may be configured of a center electrode plate 110a positioned at the center and a plurality of edge electrode plates 110b positioned at both sides of the center electrode plate so that two or more rows of LED chips may be installed in one LED module 100.

Subsequently, the electrode plates 110 respectively have a negative (−) electrode having a connection means 121 and a positive (+) electrode corresponding thereto formed in one piece at both sides in the length direction of the LED module.

In addition, the electrode plates 110 respectively have a negative (−) electrode having a connection means and a positive (+) electrode corresponding thereto formed in one piece at both sides in the width direction of the LED module.

Then, the insulation layers 130 are selected among a configuration molded in one piece in a mold provided with a plurality of projections corresponding to the flow holes or the ground holes and a configuration attaching an insulation film having flow holes.

In addition, the electrode plates 110 are formed such that the electrode plate of the positive electrode is formed to be relatively thicker or wider than the electrode plate of the negative electrode.

Subsequently, the electrode plates 110 are formed to be extended to different positions through bending surfaces 110d so as to have a maximum area.

In addition, the electrode plates 110 are configured such that a plurality of terminals extended from a plurality of positive electrodes is connected to one main electrode 140 and a plurality of terminals extended from a plurality of negative electrodes is connected to the other main electrode.

The operation of the present invention configured as described above is described.

As shown in FIGS. 2 to 14, since the LED module 100 of the present invention is a configuration of installing a plurality of electrically separated conductive electrode plates 110 to be close to each other on a same plane and then stacking insulation layers 130 on the top and bottom sides of the electrode plates, heat may be dissipated without installing a separate heat sink plate.

That is, the electrode plates 110 forming positive (+) and negative (−) polarities are configured to face each other so that electrically separated areas may have a minimum area, and both electrodes of LED chips are directly connected to adjacent counterpart electrodes.

In addition, since the electrode plates 110 are insulated by electrically separating the positive (+) and negative (−) polarities and manufactured using a conductive copper plate or the like arranged to have a maximum area corresponding to the area of the LED module 100, an effect of heat dissipation may be obtained without a heat sink plate from the entire area of the electrode plates 110 which supply power.

Then, the insulation layers 130 formed on the top and bottom sides of the electrode plates 110 are molded using an insulation material such as epoxy or urethane injected into a mold and formed to expose only terminals provided at least at one side in the length or width direction while preventing the electrode plates from being exposed to outside by wrapping the entire electrode plates when the insulation layers are molded.

In addition, ground holes 135 formed at one side of the insulation layer 130 are formed to expose a portion of the respective separated electrode plates 110 so that both ends of LED chips 170 may be grounded.

At this point, flow holes or the ground holes formed at the insulation layers 130 are molded in one piece through a plurality of projections (not shown) formed in a mold when they are molded using the mold.

In addition, when the insulation layer 130 is formed by attaching an insulation film or the like, the insulation film is attached after the flow holes or the ground holes are formed on the insulation film.

In addition, after the LED chips 170 are grounded and fixed to the electrode plates, a filling material made of a phosphor material or an optically transparent molding material is filled to cover the LED chips 170 and the ground holes 135.

Subsequently, penetration holes 113 are formed to easily connect the electrode plates 110 with a plurality of insulation layers 130, and the effect of heat dissipation may be improved since the heat dissipation area is expanded if embossing parts 115 are provided.

Then, it is configured to provide a terminal 120 in one piece at one side of the electrode plate 110 in the length or width direction, and a plurality of LED modules may be connected to each other in the length or width direction when the LED module is manufactured.

At this point, it is configured to form a connection means 121 in one piece at one side of one or more terminals 120 among the terminals 120, and the terminals can be connected without providing a separate connecting means when the terminal is connected to the connection means.

The connection means 121 is configured to form an edge connection surface 121a which is bent in a shape of character " " and a center connection surface 121c elastically supported through cut portions 121b connected to both ends of the center connection surface 121c, which are formed in one piece, so that the center connection surface 121c having elasticity may be grounded and firmly connected to the terminal while the edge connection surface wraps the terminal 120.

Then, the electrode plates 110 are configured to have a zigzag shape so that portions close to each other are alternately arranged on the cross section or formed to be extended to different positions through bending surfaces 110d so as to have a maximum area, and thus a maximum heat dissipation area is formed inside the LED module.

In addition, the electrode plates 110 are configured to be arranged in pair on the left and right sides of the LED module in the width direction, and when the LED module 100 is manufactured, two rows of LED chips are arranged, and two terminals are exposed at both sides of the LED module in the length direction.

In addition, the electrode plate 110 is configured of a center electrode plate 110a positioned at the center and a plurality of edge electrode plates 110b positioned at both sides of the center electrode plate so that two LED chips may be arranged in one LED module 100 and one terminal is exposed at each of both sides in the length direction.

At this point, the electrode plates 110 are formed such that the electrode plate of the positive electrode is formed to be relatively thicker or wider than the electrode plate of the negative electrode, and thus the heat dissipation efficiency of the electrode plate of the positive electrode side where relatively more heat is generated when power is supplied is further enhanced.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

INDUSTRIAL APPLICABILITY

The present invention relates to a method of manufacturing an LED module which may easily dissipate heat of LED chips by an LED module when the LED chips are mounted by optimizing the electrode plate area of the LED module on which the LED chips are mounted.

The invention claimed is:

1. A method of manufacturing a light emitting diode (LED) module comprising the steps of:
arranging a plurality of electrode plates to face each other on a horizontal surface, the electrode plates being electrically separated and respectively forming a positive electrode and a negative electrode so that electrically separated areas among an entire area have a minimum area, stacking insulation layers to cover top and bottom sides of the electrode plates, forming a plurality of ground holes on one side of the insulation layers to expose the electrode plates, and directly grounding both electrodes of LED chips to the ground holes which expose the electrically separated electrode plates, arranging the electrode plates to have a zigzag shape on said horizontal surface so that electrically separated portions are arranged to be close to and face each other providing a terminal at one end of each of the electrode plates, and forming a connector at one or more of the terminals, said connector including an edge connection surface which is bent and a cut portion having a center connection surface to form an LED module, said connector for directly connecting said LED module to a second LED module.

2. The method according to claim 1, further comprising forming bending surfaces which extend from the electrode plates to have a maximum area and to be positioned at positions different from those of the electrode plates when the bending surfaces are extended from the electrode plates, and exposing terminals at both sides of the electrode plates in a length direction.

3. The method according to claim 1, further comprising arranging the electrode plates in pairs toward left and right sides of the LED module in a width direction, and exposing a plurality of said terminals at both sides of the LED module in a length direction.

4. The method according to claim 1, wherein the electrode plate comprises a center electrode plate and edge electrode plates positioned at both sides of the center electrode plate in a width direction of the LED module, and said method further comprises exposing said terminals at both ends of the LED module in a length direction.

5. The method according to claim 1, further comprising providing the electrode plates with a plurality of penetration holes or embossing parts.

6. The method according to claim 1, further comprising providing the insulation layers with flow holes so that the electrode plates are exposed to an air layer.

7. The method according to claim 1, further comprising forming the electrode plates such that the electrode plate of the positive electrode is formed to be relatively thicker or wider than the electrode plate of the negative electrode.

8. The method according to claim 1, further comprising selectively forming the insulation layers through molding or by attaching an insulation film.

9. The method according to claim 1, further comprising configuring the electrode plates such that a plurality of terminals extending from a plurality of said positive electrodes are connected to one main electrode and a plurality of terminals extending from a plurality of said negative electrodes are connected to a second main electrode.

* * * * *